(12) United States Patent
Beulens et al.

(10) Patent No.: US 6,413,844 B1
(45) Date of Patent: Jul. 2, 2002

(54) SAFE ARSENIC GAS PHASE DOPING

(75) Inventors: Jacobus Johannes Beulens, Bilthoven; Theodorus Gerardus Maria Oosterlaken, Oudewater, both of (NL)

(73) Assignee: ASM International N.V. (NL)

(*) Notice: Subject to any disclaimer, the term of this patent is extended or adjusted under 35 U.S.C. 154(b) by 2 days.

(21) Appl. No.: 09/758,330

(22) Filed: Jan. 10, 2001

(51) Int. Cl.$^7$ .............................................. H01L 21/20
(52) U.S. Cl. ...................................... 438/565; 438/566
(58) Field of Search ................................ 438/542, 561, 438/565, 566, 567, 568, 564, 923

(56) References Cited

U.S. PATENT DOCUMENTS

| | | | |
|---|---|---|---|
| 4,472,212 A | | 9/1984 | Kinsbron .................... 148/188 |
| 4,939,103 A | * | 7/1990 | Szolgyemy |
| 5,122,482 A | * | 6/1992 | Hayashi et al. |
| 5,242,859 A | * | 9/1993 | Degelormo et al. |
| 5,256,162 A | * | 10/1993 | Drowley et al. |
| 5,310,711 A | * | 5/1994 | Drowley et al. |
| 5,324,684 A | | 6/1994 | Kermani et al. .............. 437/95 |
| 5,882,991 A | * | 3/1999 | Paranjpe .................... 438/565 |
| 5,925,574 A | * | 7/1999 | Aoki et al. ................. 438/563 |
| 6,075,216 A | * | 5/2000 | Economikos et al. ....... 438/559 |

OTHER PUBLICATIONS

Son g et al , "Ultrasahlloe junction formation by rapid thermal annealing of arsenic adsorptoion layer" japanees Journal of appl. Physcs. Vlol. 39 (2000)Pt.I, No.1.*

* cited by examiner

Primary Examiner—Savitri Mulpuri
(74) Attorney, Agent, or Firm—Knobbe, Martens, Olson & Bear, LLP

(57) ABSTRACT

A method is described for safe gas phase doping a semiconductor with arsenic. The substrate including a semiconductor structure is exposed to arsine at elevated temperatures within a reaction chamber. Thereafter, prior to opening the reaction chamber, a sealant layer is formed over the semiconductor structure. The sealant layer inhibits outdiffusion of arsenic when the substrate is unloaded from the reaction chamber, enabling safe unloading at relatively high temperatures. In the illustrated embodiments, the sealant layer can be formed by oxidation, nitridation or chemical vapor deposition. Forming the sealant layer can be conducted prior to, during or after cooling the substrate to an unloading temperature. Preferably, a gettering step is conducted after gas phase doping and prior to forming the sealant layer, such as by exposing the substrate to HCl vapor.

37 Claims, 5 Drawing Sheets

SAFE ARSENIC GAS PHASE DOPING

FIELD OF THE INVENTION

The present invention relates generally to the field of semiconductor processing and, more particularly, to arsenic gas phase doping for integrated circuit fabrication.

BACKGROUND OF THE INVENTION

Arsenic and phosphorus are both used as N-type dopants in semiconductor structures, such as silicon wafers. For certain applications, arsenic is particularly desirable due to the larger size of the arsenic atom and its consequently lower diffusivity as compared to phosphorus. One disadvantage of arsenic is that it is very toxic in both its metallic state and its oxide.

Although the chemical can be confined within a closed processing system during the doping process, at the end of the process the processing system needs to be opened to unload the wafers. At this point, outgasing of arsenic or arsenic compounds from the wafer and the reactor can occur, potentially causing toxic leakage into the clean room environment. As a consequence, stringent safety measures are required.

One manner of reducing the risk of toxic leakage is to unload substrates at such a low temperature that outgasing is insignificant when opening the system. This may mean reducing the temperature from the doping temperature (around 900° C.) to within the range of 300° C. to 500° C. Unfortunately, it takes a lot of time and energy to cycle a hot wall furnace every run through such large temperature differences. Hot wall batch furnaces are generally preferred for superior throughput for gas phase doping systems, but cycling through such temperature swings would greatly reduce the throughput of such systems.

U.S. Pat. No. 5,324,684 to Kermani et al. describes the use of a cold wall radiantly heated reactor for gas phase doping processes. Cold wall reactors can be cycled through temperature differences much more quickly. The disadvantage of a cold wall system, however, is that reactive gases adsorbed on the cold wall of the system are not easily purged away. A "memory effect" from residual gases or residues thus creates a safety risk when the system is opened for wafer transfer. Furthermore, if the wafers are inserted in an adjacent processing system for a subsequent treatment at elevated temperatures, there is again the risk of outgasing.

It is accordingly an object of the present invention to omit the above and other disadvantages and to provide an arsenic gas phase doping process that allows safe operation without elaborate safety measures.

SUMMARY OF THE INVENTION

In accordance with one aspect of the invention, a method is provided for gas phase doping a semiconductor with arsenic. The method includes exposing the semiconductor to a non-oxidizing, arsenic source gas within a reaction chamber. Thereafter, prior to opening the reaction chamber, a sealant layer is formed over the semiconductor structure. The sealant layer inhibits outdiffusion of arsenic when the substrate carrying the semiconductor structure is unloaded from the chamber, even at relatively high temperatures.

In the illustrated embodiments, the sealant layer can be formed by oxidation, nitridation or chemical vapor deposition. Forming the sealant layer can be conducted prior to, during or after cooling the substrate to an unloading temperature. Preferably, a gettering step is conducted after gas phase doping and prior to forming the sealant layer, such as by exposing the substrate to HCl vapor.

BRIEF DESCRIPTION OF THE DRAWINGS

These and other aspects of the invention will be appreciated in view of the detailed description below and the appended drawings. Like reference numerals are employed to indicate like process steps throughout the figures, which are meant to illustrate and not to limit the invention, and in which.

DETAILED DESCRIPTION OF THE PREFERRED EMBODIMENT

While the figures refer to "wafers," it will be understood that the principles and advantages described herein apply equally well to doping semiconductor structures on other types of substrates, such as glass substrates carrying amorphous silicon layers. The skilled artisan will readily appreciate that numerous types of semiconductor structures on numerous types of substrates require doping for electrical conductivity.

Figure 1:
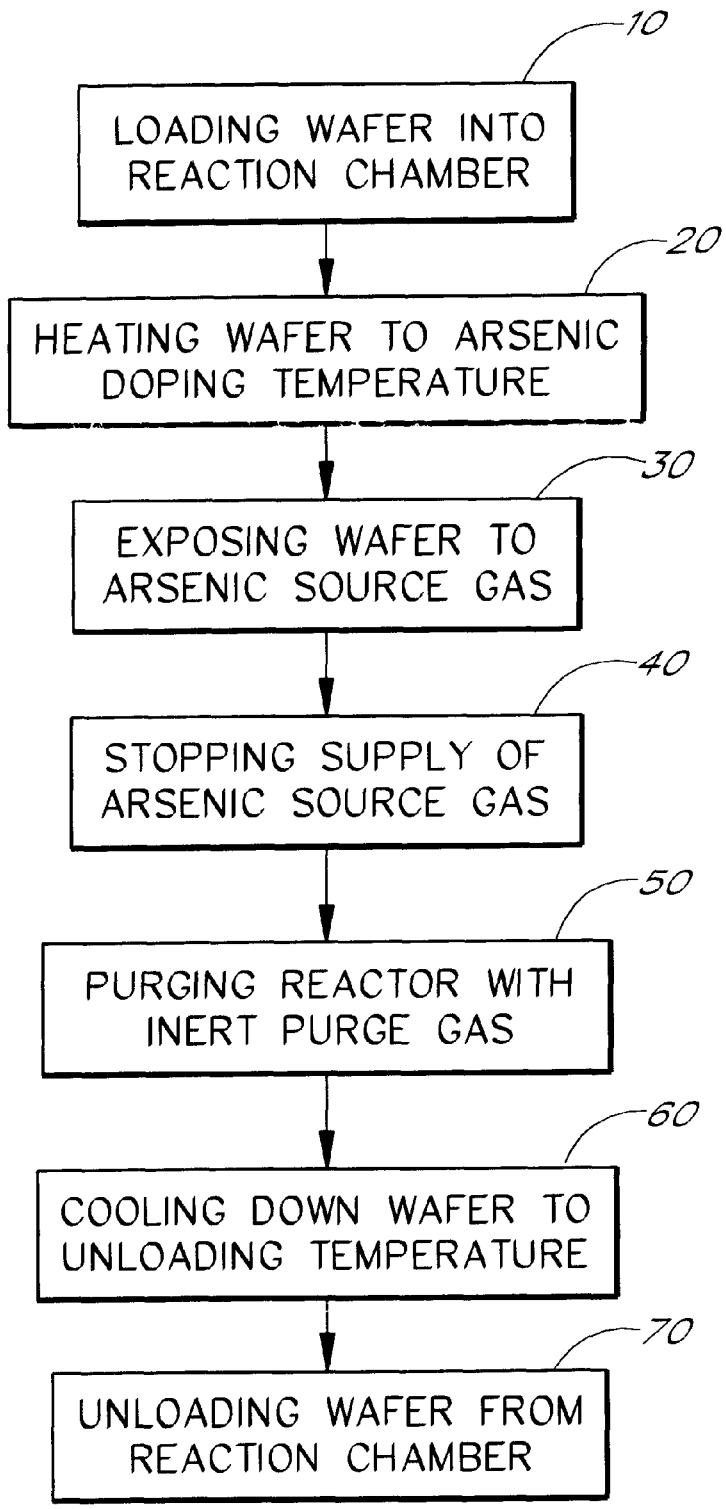
FIG. 1 illustrates a process of arsenic gas phase doping according to the prior art.

An arsenic gas phase doping process according to the prior art is illustrated in FIG. 1. Initially a substrate, including or forming a semiconductor structure, is loaded 10 into a reaction chamber. In the preferred embodiments, multiple substrates are simultaneously loaded into a batch furnace. The substrate or substrates are then heated 20 to a gas phase doping temperature. At the elevated temperature, the substrate is exposed 30 for a selected period of time to an arsenic source gas to supply arsenic to the surface of the substrate. The arsenic source gas concentration, substrate temperature and time of exposure are selected to diffuse the desired concentration of arsenic into the substrate directly from the gas phase.

The supply of the arsenic source gas is then stopped 40 and all traces of arsenic source gas are removed from the walls of the reaction chamber, from the substrate surface and from the gas phase the reactor chamber. Removal is preferably conducted by purging 50 with an inert gas, as shown. The substrate is then cooled 60 to an unloading temperature, upon which the substrate is unloaded 70 from the reaction chamber. It will be understood that the purging 50 of the reaction chamber can continue during cool-down of the substrate from the gas phase doping temperature to the unloading temperature.

The preferred embodiments, described in more detail below, employ a non-oxidizing gaseous source of arsenic, particularly arsine ($AsH_3$) and optional carrier gas. As is known in the art, by using a non-oxidizing source gas, no oxide film forms on the substrate. Such an oxide film would disadvantageously provide a barrier to diffusion of arsenic into the substrate. Furthermore, with an oxidizing arsenic source gas, arsenic oxide will also be formed. Although arsenic oxide is rather volatile, and will leave little or no toxic residues within the reaction chamber, such residues can form in the exhaust system and thereby cause a safety hazard. By employing a non-oxidizing arsenic source gas, these disadvantages are omitted because the semiconductor substrate surface remains uncovered, allowing the unimpeded doping of the substrate. The process is thus a true gas phase doping process; dopant atoms are directly transferred from the gas phase into the substrate, without forming an intermediate film on the substrate surface during the gas phase doping 30.

Figure 2:
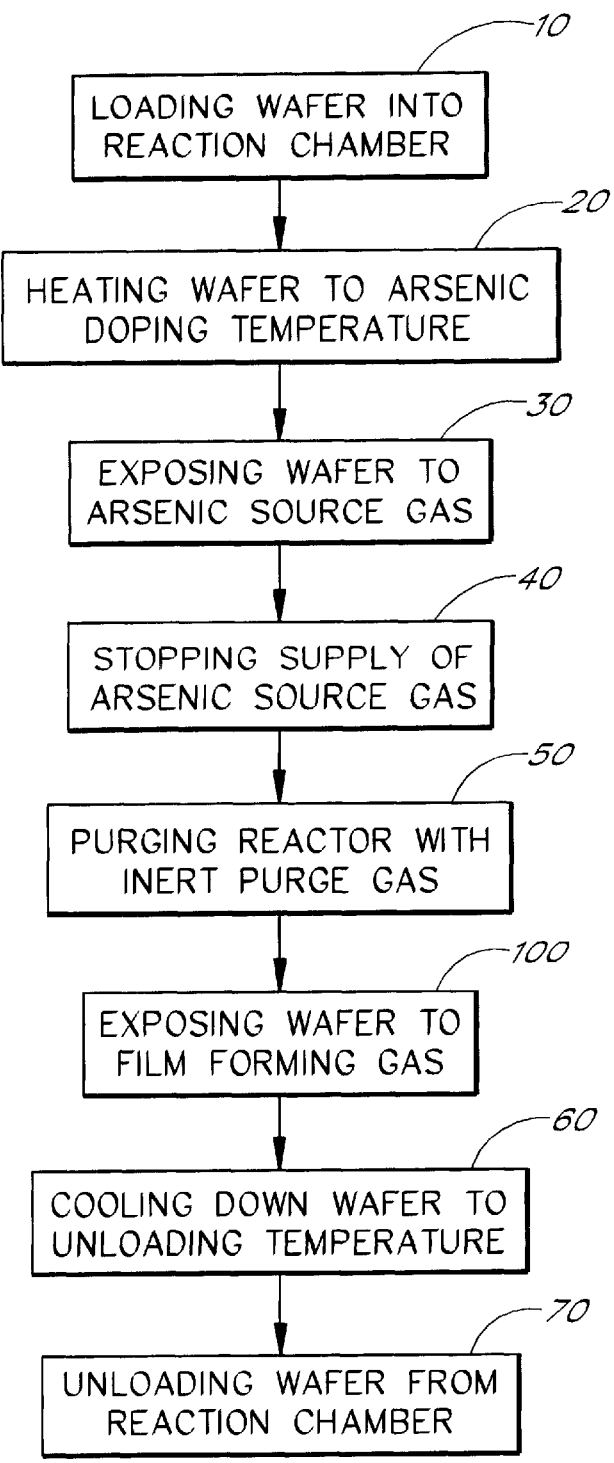
FIG. 2 illustrates a process of arsenic gas phase doping according to a first embodiment of the present invention.
Figure 3:
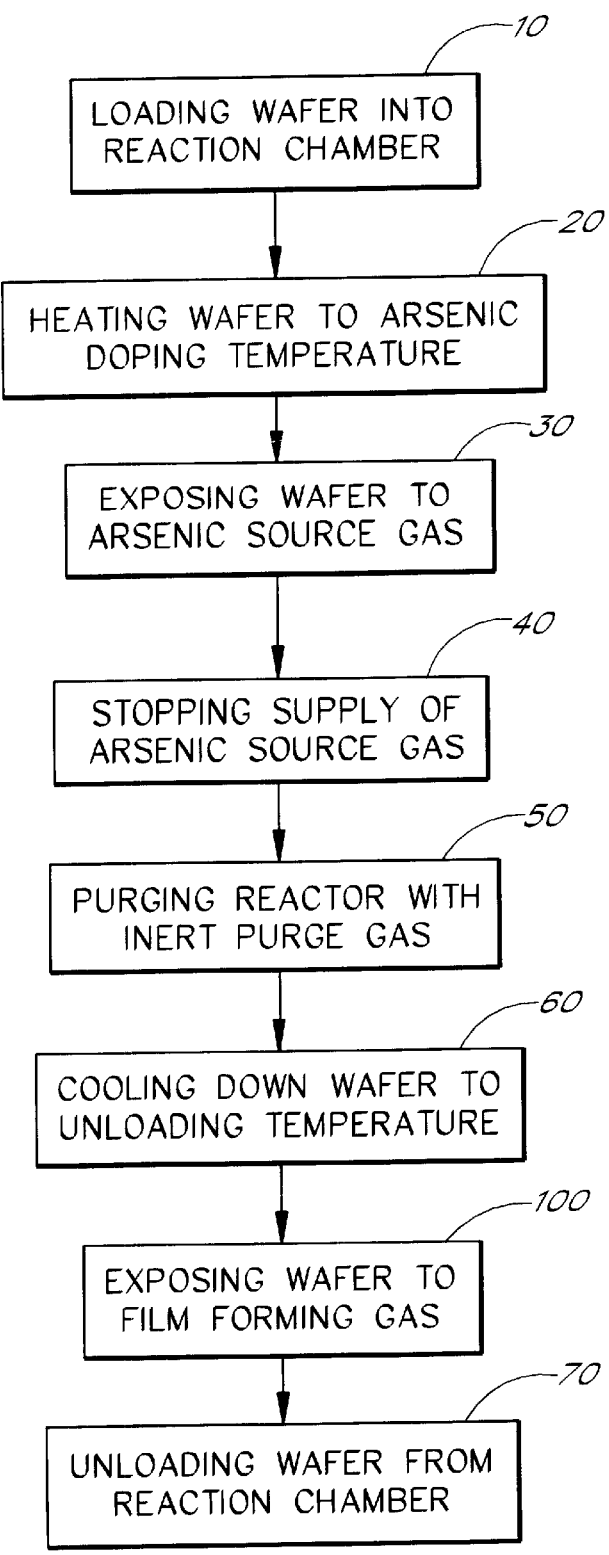
FIG. 3 illustrates a process of arsenic gas phase doping according to a second embodiment of the present invention.

With reference to FIGS. 2 and 3, the preferred embodiments of the present embodiment essentially employ the gas phase doping process of FIG. 1. In addition, however, after exposing 30 the substrate to the non-oxidizing arsenic source gas, stopping 40 and purging 50 arsenic source gas from the reaction chamber, the substrate is also exposed 100 to a film-forming gas. This exposure 100 forms a film on the surface of the substrate that preferably seals the surface of the substrate to prevent outdiffusion of arsenic from the substrate. The exposure 100 of the substrate to the film forming gas can take place before cool-down 60 (see FIG. 2), after cool-down 60 (see FIG. 3), or during cool-down 60 (see FIG. 4) of the semiconductor substrate.

Desirably, the arsenic gas phase doping process is performed at low pressure, in a low-pressure reactor. One advantage of such a low pressure reactor is that it is easier to confine the arsenic containing material within the reaction chamber because it is sealed in a vacuum tight way during processing. Most preferably, the arsenic gas phase doping is conducted in a hot wall batch reactor or furnace. The skilled artisan will appreciate that a rapid thermal processing (RTP) tool can alternatively be employed, although higher process temperatures would be desirable for RTP tools in order to speed diffusion to attain acceptable throughput.

The preferred embodiments will be described in more detail with reference to the following examples. Examples 1 and 2 relate to converting a top portion of the substrate by thermal reaction into a sealant layer after arsenic gas phase doping. Growth of the sealant layer is preferably conducted at relatively high temperatures, in accordance with the sequences of FIGS. 2 or 4. Examples 3 and 4 relate to depositing a sealant layer by chemical vapor deposition (CVD) after arsenic gas phase doping. Deposition of the sealant layer is preferably conducted at a relatively low temperature, in accordance with the sequences of FIG. 3 or 4. Example 5 relates to a gettering process after arsenic gas phase doping and before forming the sealing layer of any of Examples 1–4.

EXAMPLE 1

This example is particularly applicable to semiconductor substrates comprising a silicon structure to be doped with arsenic. Examples of such silicon structures include bare, single-crystal silicon wafers, a substrate of any construction with a blanket silicon layer (e.g., epitaxial or polysilicon) formed thereover, and a patterned substrate with exposed silicon structures. A patterned substrate might comprise, for example, a silicon wafer with field oxide or other isolation regions separating active areas.

Figure 4:
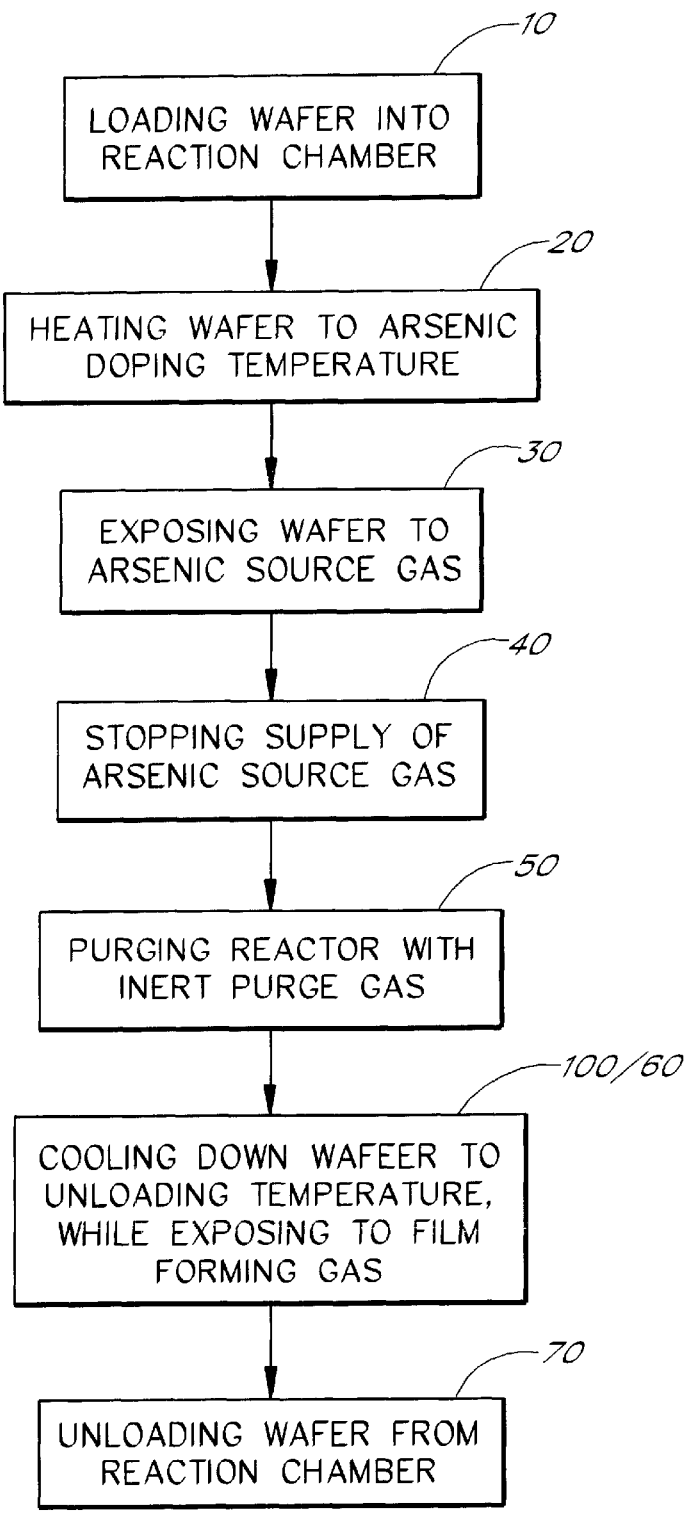
FIG. 4 illustrates a process of arsenic gas phase doping according to a third embodiment of the present invention.

Initially, with reference to FIGS. 2–4, the semiconductor substrate is loaded 10 into the reaction chamber, heated 20 and exposed 30 to the non-oxidizing arsenic source gas, preferably arsine ($AsH_3$). This arsine gas phase doping is preferably conducted at a substrate temperature greater than or equal to about 850° C., and an exemplary exposure temperature is about 900° C. The arsine is mixed with an inert carrier gas like nitrogen or argon or it can be mixed with $H_2$.

Exemplary conditions for the arsenic gas phase doping 30 include a flow of 1 slm $H_2$ carrier gas, comprising 1% by volume $AsH_3$, at 10 Torr ($1.3 \times 10^3$ Pa) for about 30 minutes at 900° C. After stopping 40 the supply of arsenic source gas to the reactor, the arsenic source gas is removed from the reaction chamber, preferably by purging 50 the chamber with an inert purge gas. The process represented by steps 10–50 can be conventional, as described with respect to FIG. 1.

After purging 50, the substrate is exposed to an oxygen source gas to form a thin silicon oxide film on top of the exposed silicon surface by thermal oxidation. Suitable oxygen source gases include oxygen ($O_2$), ozone ($O_3$), nitrous oxide ($N_2O$), nitric oxide (NO), water ($H_2O$), oxygen radicals ($O^*$), etc. Since arsenic has a relatively high silicon/silicon dioxide segregation coefficient, most of the arsenic present in the silicon that is oxidized will be driven deeper into the silicon and the arsenic concentration in the silicon dioxide will be very low. A silicon oxide film thickness of about 1 nm suffices to confine the arsenic in the semiconductor structure. Preferably, the grown oxide film has a thickness between about 1 nm and 3 nm.

The exposure to oxygen can be performed at the arsenic diffusion temperature immediately after purging 50 (FIG. 2), during cool-down 60 of the furnace to the unloading temperature (FIG. 4), or when the furnace is at the unloading temperature after cool-down 60 (FIG. 3). The substrate is preferably cooled 60 to less than about 750° C. prior to unloading 70. Cooling to such levels avoids crystallographic slip upon removing the substrate to room temperature surroundings, while minimizing occupation of the reactor during cooling. On the other hand, the unloading temperature is preferably greater than 550° C. in order to maximize throughput. More preferably, the substrate is cooled to a temperature within the range of 700° C. to 750° C.

Exemplary conditions for the oxygen exposure 100 include flowing about 1 slm $O_2$ at 10 Torr ($1.3 \times 10^3$ Pa) for about 30 minutes at 900° C., using the sequence of FIG. 2. This will result in the formation of approximately 2.5 nm silicon oxide. For the present example, where oxidation 100 is conducted at the same temperature as arsenic gas phase doping 90, the sequence of FIG. 2 is employed.

After exposure 100 of the substrate to the oxygen source gas and cooling 60 the substrate to the unloading temperature, the substrate can be unloaded 70 from the reactor. As noted above, the substrate is advantageously unloaded 70 at temperatures that, in the absence of the sealing layer, might risk arsenic outgasing, such as in the range of about 700° C. to 750° C.

EXAMPLE 2

Like Example 1, this example relates to semiconductor substrates comprising a silicon structure that is to be doped with arsenic. The substrate loading 10, heating 20, gas phase doping 30 and purging 50 can also be as described with respect to the corresponding steps in Example 1, but a different film-forming step 100 is performed. Rather than oxidation, the sealing film of the present example is formed by exposing the semiconductor substrate to a nitrogen source gas to form a silicon nitride layer thereover by thermal nitridation. Suitable nitrogen source gases include ammonia ($NH_3$), nitrogen ($N_2$), hydrazine ($H_2N_2$), nitrogen radicals ($N^*$), etc. A silicon nitride ($Si_3N_4$) film thickness of about 1 nm suffices to confine the arsenic in the semiconductor structure. Preferably, the grown nitride film has a thickness between about 1 nm and 3 nm.

Exemplary conditions for nitridation include a flow of about 500 sccm $NH_3$ at 0.5 Torr (67 Pa) for about 30 min at about 850° C. This example thus follows the sequence of FIG. 4, where the sealant film is formed at a plateau during an interrupted ramp down of substrate temperature from the arsenic gas phase doping temperature (preferably about 900° C.) to the unloading temperature (preferably between about 700° C. and 750° C.). Alternatively, the sequence of FIG. 2 can be employed, where the arsenic gas phase doping 30 is conducted at about 850° C. For other nitridation conditions, any of the sequences of FIGS. 2–4 can be used.

After exposure 100 of the substrate to the nitrogen source gas and continued cooling 60 the substrate to the unloading temperature, the substrate can be unloaded 70 from the reactor. As described with respect to Example 1, the substrate can be unloaded at temperatures that, in the absence of the sealing layer, might risk arsenic outgasing, preferably at greater than about 750° C. and more preferably in the range of about 700° C. to 750° C.

EXAMPLE 3

The substrate loading 10, heating 20, gas phase doping 30 and purging 50 can also be as described with respect to the corresponding steps in Example 1. After the gas phase doping step 40 and purging 50, the substrate is exposed 100 to source gases that form a silicon nitride film on the substrate by chemical vapor deposition (CVD). Preferred CVD source gases for silicon nitride deposition include dichlorosilane or DCS ($SiCl_2H_2$) and ammonia ($NH_3$). Another possible source gas combination is silane ($SiH_4$) and $NH_3$. Preferably, the deposition process is optimized for a silicon nitride ($Si_3N_4$) film thickness of greater than about 3 nm to confine the arsenic in the semiconductor structure. The thickness is selected to be greater than that of a nitridized layer due to nucleation effects on the substrate surface. Preferably, the deposited nitride film has a thickness between about 5 nm and 15 nm.

Exemplary conditions include a flow of about 16 sccm $SiCl_2H_2$, 160 sccm $NH_3$ at 200 mTorr (27 Pa) for about 25 minutes at 700° C., which is expected to grow a silicon nitride film with a thickness of 10 nm. Advantageously, the substrate can be unloaded at the CVD deposition temperatures, without further cooling. Thus, this example follows the sequence of FIG. 3, though the skilled artisan will appreciate that any of the sequences of FIGS. 2–4 can be employed, depending upon the CVD recipe. The sealant layer inhibits arsenic outgasing, such that further cooling is not necessary to avoid risk of toxic leakage.

In this example the film-forming gases do not convert portions of the semiconductor substrate but rather deposit over the hot substrate surfaces. Thus, nitride deposition according to this example is applicable to doping silicon as well as to doping semiconductor substrates other than silicon (e.g., III–V materials).

EXAMPLE 4

The process of Example 1 is again followed through to purging 50. After the gas phase doping step 40 and purging 50, and preferably after at least some cooling 60, the substrate is exposed 100 to source gases that form a silicon oxide film on the substrate by chemical vapor deposition (CVD).

Suitable CVD source gases include DCS and $N_2O$, $SiH_4$ and $N_2O$, and TEOS (serving as both a silicon and an oxygen source). Preferably, the deposition process is optimized for a silicon oxide ($SiO_2$) film thickness of greater than about 3 nm to confine the arsenic in the substrate. The thickness is selected to be greater than that of an oxidized layer due to nucleation effects on the substrate surface. Preferably, the deposited oxide film has a thickness between about 5 nm and 15 nm. The skilled artisan can readily determine conditions appropriate for depositing layers of this thickness for a given reactor scheme and set of source gases.

Thus, as in Example 3, the film-forming gases do not convert portions of the semiconductor substrate but rather deposit over the hot substrate surface. Accordingly, oxide deposition according to this example is applicable to doping silicon as well as to doping semiconductor substrates other than silicon (e.g., III–V materials).

EXAMPLE 5

Figure 5:
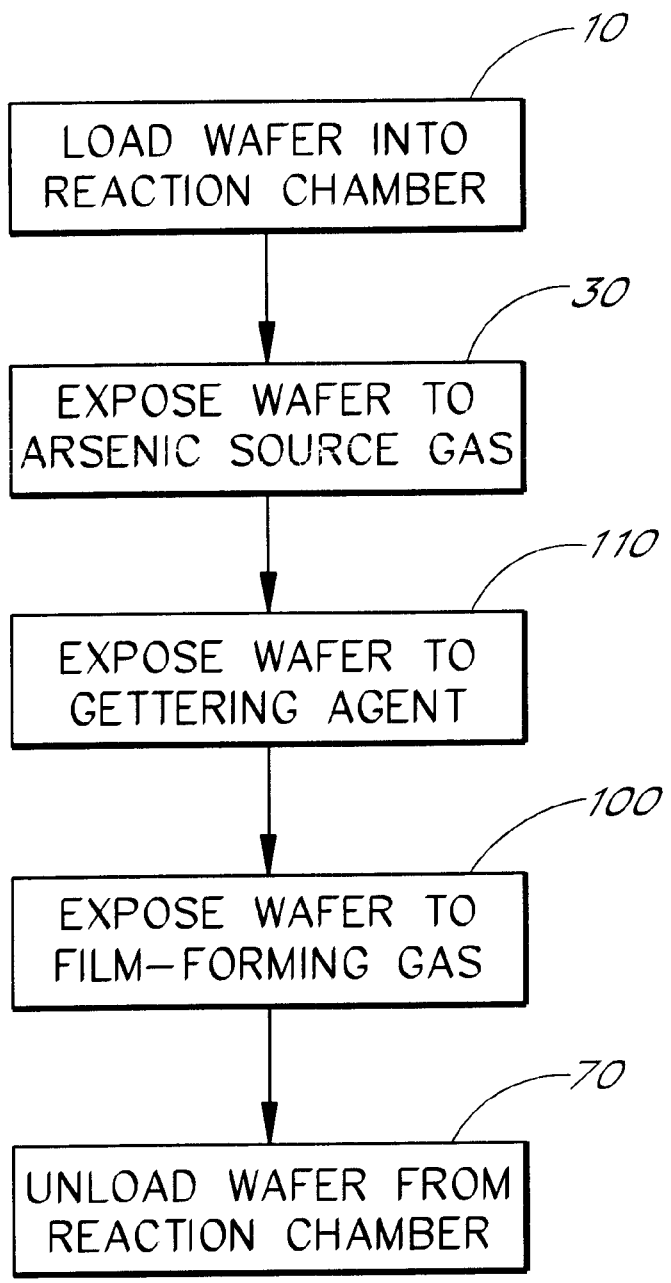
FIG. 5 illustrates a process of arsenic gas phase doping, in accordance with any of the embodiments of FIGS. 2–4, with an additional gettering step.

This example describes an optional step that can be applied to any of Examples 1–4. FIG. 5 generally illustrates the preferred process, without showing all steps. Desirably, the substrate is exposed 110 to a gettering agent after the gas phase doping step 30 and prior to the film-forming step 100. The gettering agent is selected to remove excess arsenic, particularly from the substrate surface. Suitable gettering agents include halogen-containing fluids, including gaseous $SiC_4$, $Cl_2$, and particularly hydrogen halides such as HBr, HI, HF and HCl.

The preferred embodiments employ HCl. It is known that HCl removes the arsenic by converting it to arsenic chloride, which is purged away in the gas phase because arsenic chloride has a high vapor pressure and evaporates easily at temperatures higher than 150° C.

Arsenic gettering is preferably performed at a temperature lower than the gas phase doping 30 in order to minimize silicon etching, surface roughening and outdiffusion of arsenic. Whereas the gas phase doping 30 of the preferred embodiments is performed at a temperature of about 900° C., the HCl exposure step is preferably performed at less than about 800° C., such as the unloading temperature between about 700° C. and 750° C. By way of example, the following conditions can be used: a flow of 500 sccm HCl at 0.5 Torr (67 Pa) for about 30 minutes at 700° C. Accordingly, the process is most preferably employed with the sequence of FIG. 3 or 4 and in combination with depositing a sealant layer by CVD in accordance with Examples 3 or 4.

As noted above, the methods of the preferred embodiments are preferably carried out in a hot wall, batch furnace. Alternatively, the processes can be carried out in a hot wall, single-substrate reactor or in a cold wall, single-substrate RTP reactor.

Although in the examples above the various steps are performed at low pressure, from a process point of view the arsenic gas phase doping step, oxidation, nitridation and gettering steps can alternatively be performed at atmospheric pressure. In this case, an additional flow of inert gas is preferably supplied to the reaction chamber, such that the partial pressure of the other gases remains the same as in the low-pressure version of the process.

Although this invention has been described in terms of certain preferred embodiments and suggested possible modifications thereto, other embodiments and modifications may suggest themselves and be apparent to those of ordinary skill in the art are also within the spirit and scope of this invention. Accordingly, the scope of this invention is intended to be defined by the claims that follow.

We claim:

1. A method of doping a semiconductor substrate with arsenic, comprising:
   loading a semiconductor substrate into a reaction chamber;
   heating the substrate to the arsenic doping temperature;
   exposing the substrate to a non-oxidizing arsenic doping source gas to thereby supply arsenic to the surface of the substrate;
   stopping the supply of the non-oxidizing arsenic source gas and purging the reactor with an inert purge gas;
   exposing the substrate to at least one film-forming gas that forms a film on the substrate, which film seals the surface of the substrate and inhibits outdiffusion of the arsenic out of the substrate;
   cooling down the substrate to an unloading temperature; and
   unloading the substrate from the reaction chamber at the unloading temperature.

2. The method of claim 1, wherein the non-oxidizing arsenic source gas is arsine.

3. The method of claim 1, wherein the substrate comprises a silicon structure and the film-forming gas converts a surface of the silicon structure into the film.

4. The method of claim 3, wherein the film has a thickness greater than about 1 nm.

5. The method of claim 4, wherein the film has a thickness between about 1 nm and 3 nm.

6. The method of claim 4, wherein the at least one film-forming gas comprises an oxygen source gas and converting the surface comprises oxidizing the surface of the silicon structure to form a silicon oxide.

7. The method of claim 6, wherein the oxygen source gas comprises $O_2$ and each of exposing the substrate to the non-oxidizing arsenic source gas and oxidizing comprises maintaining a substrate temperature greater than or equal to about 850° C.

8. The method of claim 4, wherein the at least one film-forming gas comprises a nitrogen source gas and converting the surface comprises nitridizing the surface of the silicon structure to form a silicon oxide.

9. The method of claim 8, wherein the nitrogen source gas comprises ammonia.

10. The method of claim 1, wherein exposing the substrate to the at least one film-forming gas comprises a chemical vapor deposition.

11. The method of claim 10, wherein the film has a thickness of greater than about 3 nm.

12. The method of claim 11, wherein the film has a thickness between about 5 nm and 15 nm.

13. The method of claim 10, wherein the chemical vapor deposition comprises reacting a nitrogen source gas with a silicon source gas to form a silicon nitride sealant film.

14. The method of claim 13, wherein the nitrogen source gas comprises ammonia and the silicon source gas comprises dichlorosilane.

15. The method of claim 10, wherein the chemical vapor deposition comprises reacting an oxygen source gas with a silicon source gas to form a silicon oxide sealant film.

16. The method of claim 10, wherein the chemical vapor deposition comprises decomposing a single source gas on the substrate surface.

17. The method of claim 1, wherein exposing the substrate to at least one film-forming gas is conducted prior to cooling down the substrate.

18. The method of claim 1, wherein exposing the substrate to the at least one film-forming gas is conducted while cooling down the substrate.

19. The method of claim 1, wherein exposing the substrate to the at least one film-forming gas is conducted after cooling down the substrate.

20. The method of claim 1, wherein exposing the substrate to the non-oxidizing arsenic source gas comprises maintaining a substrate temperature greater than about 850° C.

21. The method of claim 1, wherein the substrate is unloaded at a temperature greater than about 550° C.

22. The method of claim 21, wherein the substrate is unloaded at a temperature between about 700° C. and 750° C.

23. The method of claim 1, further comprising gettering arsenic from a surface of the substrate after exposing the substrate to the arsenic source gas and prior to exposing the substrate to the film forming gas.

24. The method of claim 23, wherein gettering comprises exposing the substrate to a halogen-containing gas.

25. The method of claim 24, wherein the halogen-containing gas comprises HCl.

26. The method of claim 24, wherein gettering is conducted at a substrate temperature less than about 800° C.

27. A method of arsenic doping a semiconductor structure on a workpiece within a hot wall reaction chamber, comprising:
   exposing the semiconductor structure to a non-oxidizing, arsenic doping source gas within the reaction chamber;
   forming a sealant layer over the semiconductor structure within the reactor prior to opening the reaction chamber and after exposing to the arsenic source gas; and
   gettering arsenic from surfaces of the workpiece after exposing to the arsenic source gas and prior to forming the sealant layer.

28. The method of claim 27, wherein exposing comprises maintaining a workpiece temperature greater than about 850° C. and further comprising, after forming the sealant layer, unloading the workpiece from the reaction chamber at a workpiece temperature greater than about 550° C.

29. The method of claim 27, wherein forming the sealant layer comprises reacting a film-forming gas with a surface of the semiconductor structure.

30. The method of claim 29, wherein forming the sealant layer comprises nitridizing a surface of the semiconductor structure.

31. The method of claim 29, wherein forming the sealant layer comprises oxidizing a surface of the semiconductor structure.

32. The method of claim 27, wherein forming the sealant layer comprises depositing the layer by chemical vapor deposition.

33. The method of claim 32, wherein the sealant layer comprises silicon nitride.

34. The method of claim 27, wherein the semiconductor structure comprises silicon.

35. The method of claim 27, wherein the workpiece comprises a silicon wafer and the semiconductor structure comprises a top surface of the silicon wafer.

36. The method of claim 27, wherein the arsenic source gas comprises arsine.

37. The method of claim 27, wherein exposing to the arsenic source gas and forming the sealant layer are conducted at a low pressure.

* * * * *